United States Patent [19]

Inoue

[11] 4,300,102

[45] Nov. 10, 1981

[54] VARIABLE GAIN CONTROL CIRCUIT

[75] Inventor: Shigeki Inoue, Toyokawa, Japan

[73] Assignee: Hitachi, Ltd., Tokyo, Japan

[21] Appl. No.: 38,312

[22] Filed: May 11, 1979

[30] Foreign Application Priority Data

May 12, 1978 [JP] Japan .................................. 53-55564

[51] Int. Cl.³ .......................... H03F 3/45; H03G 3/00
[52] U.S. Cl. .................................... 330/254; 330/260
[58] Field of Search ........................ 330/69, 254, 260

[56] References Cited

U.S. PATENT DOCUMENTS

T886,006  5/1971  Nichols .......................... 330/254 X
3,452,289  6/1969  Ryan .................................. 330/254

*Primary Examiner*—James B. Mullins
*Attorney, Agent, or Firm*—Craig and Antonelli

[57] ABSTRACT

The emitters of a pair of transistors are connected to each other. A voltage/current converter circuit for converting an AC voltage into an AC current is inserted between ground and the junction point of said emitters, thus making up a first differential amplifier. With an input signal applied to the voltage/current converter circuit, an output signal is produced from one of the transistors of the first differential amplifier. With a fixed bias voltage applied to the other transistor of the first differential amplifier, the bias voltage for said one of said transistors is changed, thus controlling the amplitude of the output signal. A second differential amplifier has first and second input terminals. The first input terminal thereof is supplied with an output signal of said one of the transistors, and the second input terminal thereof with the output signal of the other transistor, thereby producing a second output signal proportional to the difference between the output voltages of the one and other transistors. This second output signal is fed back to said one of the transistors, thus reducing the distortion of the output signal of said one of the transistors.

5 Claims, 10 Drawing Figures

VARIABLE GAIN CONTROL CIRCUIT

BACKGROUND OF THE INVENTION

The present invention relates to a gain control circuit for controlling a signal level, and more particularly relates to a variable gain control circuit for regulating the level of a signal supplied to a load by controlling the gain of an amplifier.

In a transmission line for transmitting a low frequency signal or a high frequency signal, and an amplifier for amplifying such signals, it is necessary to control the amplitude of a signal flowing through the transmission line or the amplifier, as the case may be, in order to attain the proper level of the output signal thereof.

A variable attenuator is commonly used as a conventional device for controlling the amplitude of a signal. A low frequency signal, a high frequency signal or the like is temporarily amplified to a sufficiently high level and then attenuated by a variable attenuator, thereby producing output signal of proper level. The variable attenuator comprises a variable resistor in most cases. The variable resistor in turn includes an insulating substrate, a resistor member disposed on the insulating substrate and a slider slidably in contact with the surface of the resistor member. Thus, a division of the signal applied to the resistor member is obtained. The slider is adapted to slide mechanically along the surface of the resistor member.

In controlling the signal level by use of this resistor member, the slider of the variable resistor is required to be slided mechanically. Therefore, in the case where the remote control of the mechanical operation is carried out, it is necessary to provide a driver for moving the slider of the variable resistor, so that the gain control system becomes complex.

On the other hand, a variable gain amplifier has hitherto been proposed in which the amplitude of a signal can be increased or decreased continuously without any mechanical operation. This variable gain amplifier includes two amplifying transistors of the same conductivity type with the emitters thereof connected to each other. The collector-emitter path of a voltage/current conversion transistor is connected between the junction point of the amplifying transistors and ground so that a signal is applied to the base of the voltage/current conversion transistor. The base of one of the two amplifying transistors is supplied with a fixed bias voltage, while the base of the other amplifying transistor is connected to a variable voltage bias source, the voltage of which may be changed, thus making it possible to take out an output signal from the collector of the other amplifying transistor. The two amplifying transistors make up a differential amplifier. By changing the base bias voltage of the other transistor, the collector current thereof is increased or decreased as desired, so that the collector current of one amplifying transistor is decreased or increased in accordance with the increase or decrease in the collector current of the other amplifying transistor, respectively, with the result that a signal having an amplitude proportional to the collector current of one amplifying transistor is produced from the collector of the other amplifying transistor.

The output signal of this variable gain amplifier undesirably contains a distortion. As described in detail later, each of the emitter, base and collector layers of a transistor has a bulk resistance relating to semiconductors making up the transistor. Further, a bonding resistance exists between the emitter electrode, base electrode or collector electrode and the respective terminals connected with each of the electrodes. Thus, the transistor presents such a condition that a resistor of a value equal to the sum of the bulk resistance and the bonding resistance would be connected to each of the emitter, base and collector of the transistor. Accordingly, each of the above-mentioned two amplifying transistors of the variable gain amplifier has a bulk resistance and a bonding resistance connected to the emitter, base and collector thereof. Of these bulk resistance and bonding resistance, those connected to the emitter cause a distortion in the output signal. In the collector-emitter conduction path of the two amplifying transistors, a DC current determined by the base-emitter bias voltage and an AC signal current supplied from the voltage/current conversion transistor flow through the bulk resistor and the bonding resistor, so that voltages are generated across the bulk resistor and the bonding resistor for the emitters of the transistors by the DC current and the AC signal current. Of these voltages, the AC voltage generated by the AC signal current changes the base-emitter bias voltage of the respective amplifying transistors, resulting in a distortion of the output signal. The low-frequency wave amplifier for amplifying a music signal recorded in a disc record is especially required to produce an output signal which is low in distortion. The variable gain amplifier which produces the distortion in the output signal cannot be used as the low-frequency amplifier.

SUMMARY OF THE INVENTION

Accordingly, it is an object of the present invention to provide a gain control circuit which produces an output signal containing little distortion and in which the level of the output signal may be changed by electrical control.

Another object of the present invention is to provide a variable gain control circuit with a low output signal distortion in which the level of the output signal may be changed by remote control.

According to the present invention, there is provided a gain control circuit comprising a voltage/current conversion circuit for converting an AC signal voltage into an AC signal current, and a differential-type gain control circuit including a first and a second semiconductor amplifier element each having an input terminal, an output terminal and a grounding terminal, the grounding terminals of the first and second semiconductor amplifier elements being connected to each other, the output terminal of the voltage/current conversion circuit being connected to a junction point of the grounding terminals, the voltage between the input terminals of the first and second semiconductor amplifier elements being controlled, thereby to change the current-dividing ratio of the current flowing through the first and second semiconductor amplifier elements, thus producing an output signal proportional to the input signal from the output terminal of the first or second semiconductor amplifier elements, the gain control circuit further comprising a negative feedback differential amplifier connected to the output terminals of the first and second semiconductor amplifier elements for producing an output proportional to the difference between the output currents of the first and second semiconductor amplifier elements, the output of the negative feedback amplifier being negatively fed back to the input terminals of the first and second semiconductor amplifier elements.

DESCRIPTION OF THE PRIOR ART

Figure 1:
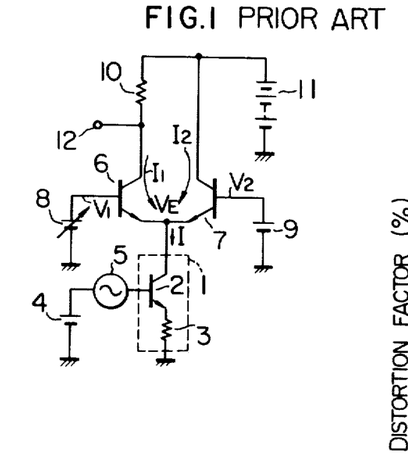
FIG. 1 is a diagram showing a conventional variable gain amplifier circuit.

Prior to explaining the embodiments of the gain control circuit according to the present invention, the operation of the conventional variable gain amplifier shown in FIG. 1 and the causes of a distortion will be explained. In FIG. 1 showing the conventional variable gain amplifier, a voltage/current conversion transistor 2 and a resistor 3 connected between the emitter of the transistor 2 and ground make up a voltage/current conversion circuit 1. The base of the transistor 2 is connected with a signal source 5. A fixed bias source 4 for supplying a bias voltage of predetermined magnitude between the base and emitter of the transistor 2 is inserted between the signal source 5 and ground. The transistor 2 provides a collector current in accordance with the change in the AC voltage of the signal source 5, thereby converting the AC voltage into an AC current. Numerals 6 and 7 denote amplifying transistors of the same conductivity type, the emitters of which are connected to each other. The junction point of the transistors 6 and 7 is connected to the collector of the transistor 2. The base of the amplifying transistor 7 is connected to the positive terminal of the fixed bias source 9, and the collector thereof to the positive terminal of a power supply 11. The base of the other amplifying transistor 6 is connected to the positive terminal of the variable voltage bias source 8 the voltage of which is variable. The collector of the transistor 6 is connected to the positive terminal of the power supply 11 through a resistor 10. The collector of the transistor 6 is also connected to the output terminal 12. The two transistors 6 and 7 have their emitters connected with each other, and a voltage/current converter circuit 1 providing a common impedance is inserted between ground and the junction point of the transistors 6 and 7, thus making up a differential amplifier. The collector current of the transistor 2 is divided into the two transistors 6 and 7. By changing the voltage of the variable voltage bias source 8, the dividing ratio of the current flowing through the transistors 6 and 7 is changed accordingly. With the increase in the collector current of the transistor 6, the collector current of the transistor 7 decreases, and vice versa. The voltage generated across the resistor 10 connected to the collector of the transistor 6 is taken out at the terminal 12 as an output signal. The power supply 11 is a DC voltage source for supplying a DC current to the transistors 6 and 7.

In this circuit configuration, assume that the output current I of the transistor 2 is $I = I_0 + i_0 \sin \omega t$, the base voltage of the transistor 6 is $V_1$, the base voltage of the transistor 7 is $V_2$, the currents flowing through the transistors 6 and 7 are $I_1$ and $I_2$, respectively, the emitter voltage of the transistors is $V_E$, the saturated reverse current is $I_S$, the electric charges are q, Boltzmann's constant is k, and the absolute temperature is T. Then the current $I_1$ flowing through the transistor 6 and the current $I_2$ flowing through the transistor 7 are expressed as $$I_1 = I_s \cdot \exp\left\{ \frac{q}{kT}(V_1 - V_E) - 1 \right\} \tag{1}$$

$$I_2 = I_s \cdot \exp\left\{ \frac{q}{kT}(V_2 - V_E) - 1 \right\} \tag{2}$$

$$I_1 + I_2 = I_0 + i_0 \sin \omega t \tag{3}$$

Consider the case where the transistors 6 and 7 are biased in forward direction. The second terms of the equations (1) and (2) are ignored, and therefore they are rewritten as equations (4) and (5) below, respectively.

$$I_1 = I_s \cdot \exp\left\{ \frac{q}{kT}(V_1 - V_E) \right\} \tag{4}$$

$$I_2 = I_s \cdot \exp\left\{ \frac{q}{kT}(V_2 - V_E) \right\} \tag{5}$$

Resolving the equations (3) and (4), equations (6) and (7) below are obtained.

$$I_1 = \frac{1}{1 + \exp\left\{ \frac{q}{kT}(V_2 - V_1) \right\}} (I_0 + i_0 \sin \omega t) \tag{6}$$

$$I_2 = \frac{1}{1 + \exp\left\{ \frac{q}{kT}(V_1 - V_2) \right\}} (I_0 + i_0 \sin \omega t) \tag{7}$$

The base voltage $V_1$ of the transistor 6 and the base voltage $V_2$ of the transistor 7 are constant DC voltages. Therefore, the output currents $I_1$ and $I_2$ of the transistors 6 and 7 shown by equations (6) and (7) are proportional to the input signal current $I_0 + i_0 \sin \omega t$.

Figure 2:
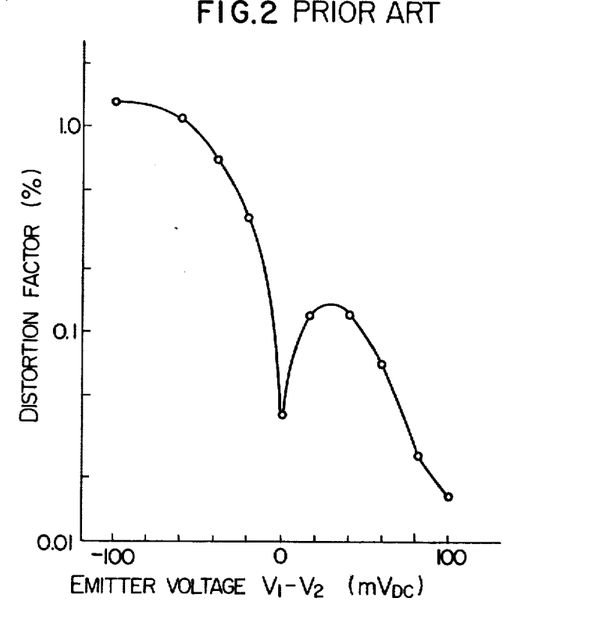
FIG. 2 shows the characteristic curve of the distortion factor of the variable gain amplifier circuit shown in FIG. 1.

In spite of the fact that no distortion should occur theoretically in the output currents $I_1$ and $I_2$, actual measurements thereof show that these currents contain a distortion as shown in FIG. 2. It is thus not desirable to use this variable gain amplifier since the output signal thereof contains a distortion. Especially, this system cannot be used as amplifier for reproducing a music signal recorded in the disc record or the like since an increased distortion occurs.

In FIG. 2 showing the distortion characteristics, the abscissa represents the voltage difference between the base voltage $V_1$ of the transistor 6 and the base voltage $V_2$ of the transistor 7, and the ordinate represents the distortion factor. It is seen that the distortion factor is small when the base voltage of the two transistors 6 and 7 are equal to each other, while the distortion is increased when the base voltages of the transistors 6 and 7 are different from each other.

Figure 3:
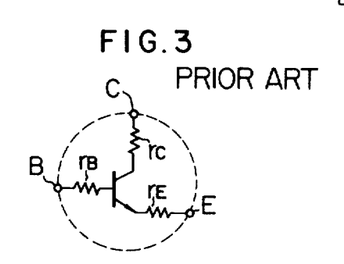
FIG. 3 is a circuit diagram showing an ordinary transistor configuration.

In the variable gain amplifier of FIG. 1, the transistors 6 and 7 are assumed to be ideal. Generally, however, each layer of the emitter, base and collector of the transistor has a bulk resistance relating to the semiconductor making up the transistor, and also a bonding resistance is offered between the emitter electrode, base electrode or the collector electrode and the terminal connected to each of the electrodes. This is equivalent to the situation where a resistor of a value equal to the sum of the bulk resistance and the bonding resistance is connected to each of the emitter, base and collector of the transistor. As a result, as shown in FIG. 3, the emitter, base and collector of the transistor are considered to have resistors $r_E$, $r_B$ and $r_C$ respectively each of which is the sum of the bulk resistance specific to the semiconductor making up the transistor and the bonding resistance offered in taking out the terminals of the emitter electrode, base electrode and collector electrode respectively. In view of the facts that the collector bulk resistor $r_C$ is not directly related to the attenuation characteristics, and that the base current is so ignorably small that the bulk resistor $r_B$ of the base layer does not affect the characteristics of the transistor, the circuit of FIG. 1 may be replaced by that of FIG. 4.

Figure 4:
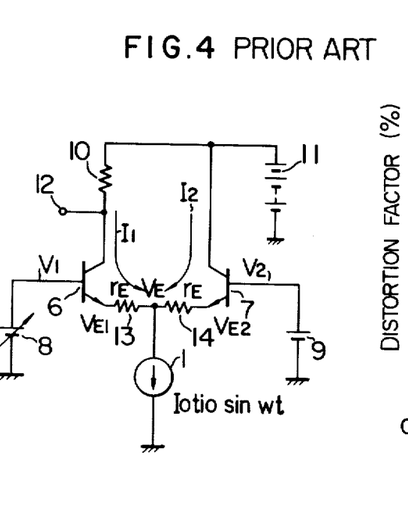
FIG. 4 shows an equivalent circuit for analyzing the distortion of the output signal of the variable gain amplifier circuit shown in FIG. 1.

In FIG. 4 the emitter of the transistor 6 is connected with the emitter of the transistor 7 through the emitter bulk resistor 13 in the emitter layer of the transistor 6 and the emitter bulk resistor 14 in the emitter layer of the transistor 7. A voltage/current converter circuit 1 is inserted as a current source between ground and the junction point of the emitter bulk resistors 13 and 14. Let the current flowing in the transistor 6 be $I_1$, the current flowing in the transistor 7 be $I_2$, the resistance values of the emitter resistors 13 and 14 be $r_E$ respectively, the voltage at the junction point of the emitter electrode of the transistor 6 and the emitter bulk resistor 13 be $V_{E1}$, the voltage at the junction point of the emitter electrode of the transistor 7 and the emitter bulk resistor 14 be $V_{E2}$, and the voltage at the junction point of the two bulk resistors 13 and 14 be $V_E$. Then the currents $I_1$ and $I_2$ flowing through the transistors 6 and 7 respectively are expressed as $$I_1 = I_s \cdot \exp\left( \frac{q}{kT} (V_1 - V_{E1}) \right) \quad (8)$$

$$I_2 = I_s \cdot \exp\left( \frac{q}{kT} (V_2 - V_{E2}) \right) \quad (9)$$

$$I_1 + I_2 = I_0 + i_0 \sin\omega t \quad (10)$$

-continued $$V_{E1} = V_E + I_1 r_E \quad (11)$$

$$V_{E2} = V_E + I_2 r_E \quad (12)$$

From equations (8) and (11), $$I_1 = I_s \cdot \exp\left( \frac{q}{kT} (V_1 - V_E - I_1 r_E) \right) \quad (13)$$

From equations (9) and (12), $$I_2 = I_s \cdot \exp\left( \frac{q}{kT} (V_2 - V_E - I_2 r_E) \right) \quad (14)$$

Further, from equations (13), (14) and (10), the equation below is obtained.

$$I_1 = \frac{1}{1 + \exp\left[ \frac{q}{kT} \{V_2 - V_1 - (I_2 - I_1) r_E\} \right]} (I_0 + i_0 \sin\omega t) \quad (15)$$

As obvious from equation (15), the output current $I_1$ of the transistor 6 changes in magnitude in accordance with the signal current, resulting in a distortion. The distortion K calculated from equation (15) is given as $$K = \frac{1}{4} i_0 \cdot r_E \cdot \frac{q}{kT} \cdot$$

$$\frac{\left[ 1 - \exp\left( \frac{q}{kT} (V_2 - V_1) \right) \right] \cdot \exp\left( \frac{q}{kT} (V_2 - V_1) \right)}{\left[ 1 + \exp\left( \frac{q}{kT} (V_2 - V_1) \right) \right]^2} \times \quad (16)$$

$$100 \ (\%)$$

Figure 5:
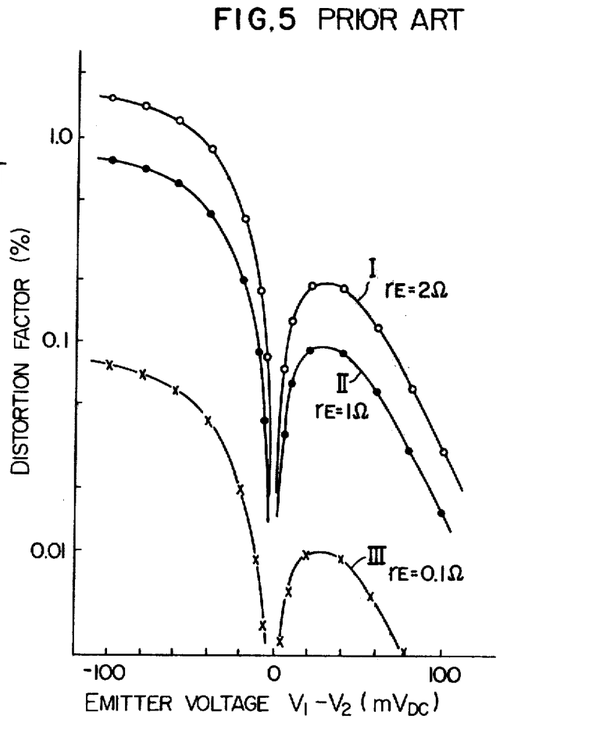
FIG. 5 shows a distortion factor characteristics curve representing the theoretical value of the distortion of the output signal produced from the equivalent circuit shown in FIG. 4.

Equation (16) is illustrated as in FIG. 5, which coincides with the actual measurement shown in FIG. 2.

It was thus found that the increased distortion in the circuit of FIG. 1 is caused by the emitter bulk resistors 13 and 14 of the transistors of FIG. 4 attributable to the structure of the transistor. As shown in FIG. 4, the emitter bulk resistors 13 and 14 are equivalent to the emitter resistors 13 and 14 being inserted in the transistors 6 and 7 respectively. When the currents $I_1$ and $I_2$ flow in the transistors 13 and 14 respectively, the base-emitter voltage is modulated by the voltages $i_1 r_E$ and $i_2 r_E$ generated by the AC components $i_1$ and $i_2$ of the currents $I_1$ and $I_2$, thus resulting in the distortion. In FIG. 5, the curve I represents the distortion factor characteristic for the emitter bulk resistor $r_E$ of two ohms, and the curve II the distortion factor characteristic for the emitter bulk resistor $r_E$ of one ohm. The curve III shows the distortion factor characteristic for the emitter bulk resistor $r_E$ of 0.1 ohm. As noted, the distortion is decreased with the decrease in the emitter bulk resistor $r_E$.

DESCRIPTION OF THE PREFERRED EMBODIMENTS

According to the present invention, in consideration of the fact that the distortion is caused by the AC voltage based on the product of the signal current dividedly flowing through each transistor and the emitter bulk resistance thereof, the voltage equal to the AC component of the voltage generated across the emitter bulk resistor is produced from the output current and is fed back to the base of the transistor, thereby reducing the distortion.

A gain control circuit according to the present invention will be described below with reference to the drawings.

Figure 6:
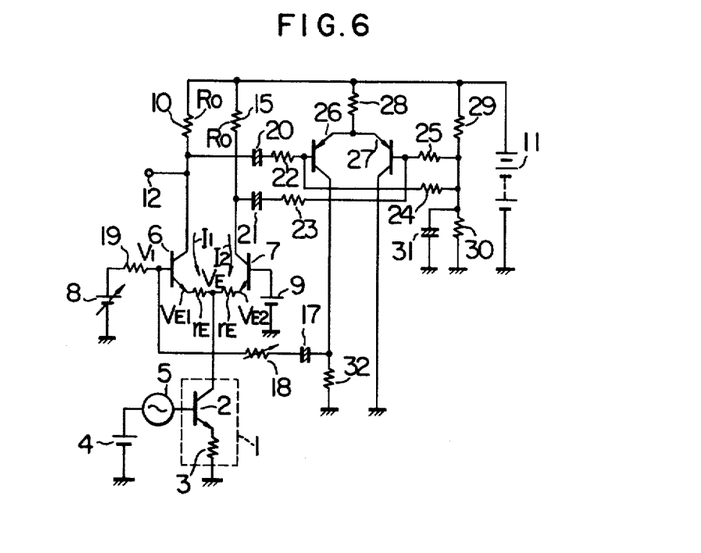
FIG. 6 is a circuit diagram showing an embodiment of the gain control circuit according to the present invention.

The diagram of FIG. 6 shows a gain control circuit according to an embodiment of the present invention. The two amplifying transistors 26 and 27 make up a differential amplifier. The collector of the transistor 7 is connected to the positive electrode of the power supply 11 through the resistor 15. The base of the transistor 26 is connected to the collector of the transistor 6 through the DC-blocking capacitor 20 and the resistor 22. The base of the transistor 27 is connected to the collector of the transistor 7 through the DC-blocking capacitor 21 and the resistor 23. The emitters of the transistor 26 and 27 are connected with each other and further, through a common resistor 28, to the positive electrode of the power supply 11. Two series-connected resistors 29 and 30 are inserted between the positive and negative electrodes of the power supply 11. At the junction points of the two resistors 29 and 30, the bases of the transistors 26 and 27 are connected through resistors 24 and 25 respectively. A by-pass capacitor 31 is connected in parallel to the resistor 30. The collector of the transistor 27 is directly grounded, and the collector of the transistor 26 is grounded through the resistor 32 on the one hand and connected to the base of the transistor 6 through the capacitor 17 and the variable resistor 18 on the other hand. The resistors 22, 24 and the transistors 26, 27 are for preventing input saturation. The resistor 18 is a semi-fixed one which is capable of regulating the amount of feedback to minimize the distortion. The resistors 29 and 30 are for applying a bias voltage for the transistors 26 and 27. The emitters of the transistors 6 and 7 making up a first differential amplifier are connected with each other, a junction point of which is connected to the collector of the voltage/current conversion transistor 2. The base of the transistor 6 is connected through the resistor 19 to the bias power supply 8 capable of changing the voltage thereof. The base of the transistor 7 is connected to the fixed bias power supply 9. The base of the transistor 2 is connected with the signal source 5 and the fixed bias source 4 to which the signal source 5 is connected in series.

In this circuit, the base of the transistor 2 is supplied with the DC voltage of the fixed bias source 4 and the AC voltage of the signal source 5. The current proportional to the sum of a voltage from the bias source 4 and a signal voltage from the signal source 5 flows into the collector of the transistor 2. This current changes in accordance with the changes of the AC voltage of the signal source. The transistor 2 converts the AC voltage of the signal source 5 into an AC current and supplies it from the collector thereof to the emitters of the transistors 6 and 7. The collector current of the transistor 2 flows dividedly into the transistors 6 and 7, so that the voltage proportional to the collector current of the transistor 6 is produced across the load resistor 10 and taken out as an output signal at the output terminal 12. By changing the output voltage of the bias source 8, the ratio between the current in the transistor 6 and the current in the transistor 7 is changed, thereby changing a signal voltage produced at the output terminal 12. A voltage proportional to the current $I_1$ flowing into the transistor 6 is generated across the load resistor 10 of the transistor 6. Since the load resistor 15 is connected with the collector of the transistor 7, a voltage proportional to the current flowing through the transistor 7 is generated across the load resistor 15. The voltage generated across the load resistor 10 is supplied to the output terminal 12 while only the AC component thereof is supplied through the resistor 22 and the capacitor 20 to the base of the transistor 26. The DC component of the voltage generated across the load resistor 15 of the transistor 7, on the other hand, is blocked by the capacitor 21, so that only the AC component thereof is supplied to the base of the transistor 27 through the capacitor 21 and the resistor 23. The bases of the transistors 26 and 27 are supplied with a fixed bias voltage which is the result of dividing the voltage of the power supply 11 by the resistors 29 and 30, and therefore each of the bases of the transistors 26 and 27 is supplied with the sum of the fixed bias voltage and an AC signal. The transistor 26 amplifies the output signal of the transistor 6, and the transistor 27 amplifies the output signal of the transistor 7. The transistors 26 and 27 have emitters connected to a common resistor 28, making up a differential amplifier, and therefore the output signal of the transistor 26 generated at the load resistor 32 of the transistor 26 has a voltage level proportional to the difference between the voltage supplied to the base of the transistor 26 and the voltage applied to the base of the transistor 27. Therefore, if the resistance value of the load resistor 10 of the transistor 6 is rendered equal to that of the load resistor 15 of the transistor 7, the output signal voltage of the transistor 26 generated across the load resistor 32 is proportional to the difference between the collector current of the transistor 6 and the collector current of the transistor 7. The DC component of the output signal of the transistor 26 is blocked by the capacitor 17, while the AC component only is passed through the resistor 18 and fed back to the base of the transistor 6.

Let the resistance values of the load resistors 10 and 15 of the transistors 6 and 7 be $R_O$, the emitter voltage of the transistor 6 be $V_{E1}$, the emitter voltage of the transistor 7 be $V_{E2}$, the emitter bulk resistor of the transistors 6 and 7 be $r_E$, and the constant of the circuit for feeding back the signal from the collector of the transistor 26 to the base of the transistor 6 be $k'$. The collector currents $I_1$ and $I_2$ of the transistors 6 and 7 are given as shown below.

$$I_1 = I_s \cdot \exp\left[ \frac{q}{kT} V_1 + (I_1 - I_2)R_0 k' - V_{E1} \right] \quad (17)$$

$$I_2 = I_s \cdot \exp\left\{ \frac{q}{kT} (V_2 - V_{E2}) \right\} \quad (18)$$

where $$V_{E1} = V_E + I_1 r_E \quad (19)$$

$$V_{E2} = V_E + I_2 r_E \quad (20)$$

$$I_1 + I_2 = I_0 + i_0 \sin \omega t \quad (21)$$

From these equations, the equations below are introduced.

$$\frac{I_2}{I_1} = \exp\left[\frac{q}{kT}\{(V_2 - V_1) - (I_1 - I_2)R_0k' - (V_{E2} - V_{E1})\}\right] \quad (22)$$

$$V_{E2} - V_{E1} = (I_2 - I_1)r_E \quad (23)$$

$$I_0 + i_0 \sin \omega t = \quad (24)$$

$$\left[\exp\left(\frac{q}{kT}[(V_2 - V_1) - (I_1 - I_2)R_0k' - (V_{E2} - V_{E1})]\right) + 1\right]I_1$$

From equations (23) and (24), $$I_1 = \frac{1}{1 + \exp\left[\frac{q}{kT}\{(V_2-V_1) + (I_2-I_1)R_0k' - (I_2-I_1)r_E\}\right]} (I_0 + i_0\sin\omega t) \quad (25)$$

In order to establish the relation $(I_2 - I_1)R_0k' - (I_2 - I_1)r_E = 0$ in equation (25), it is required that $$k' = \frac{r_E}{R_0},$$

whereby the equation (25) is rewritten as $$I_1 = \frac{1}{1 + \exp\left\{\frac{q}{kT}(V_2 - V_1)\right\}} (I_0 + i_0\sin\omega t) \quad (26)$$

The transistors 26 and 27 produce a signal of the magnitude proportional to the difference between the collector current $I_1$ of the transistor 6 and the collector current $I_2$ of the transistor 7, i.e., $(I_1 - I_2)$ which signal is fed back to the transistor 6. Thus the term of the current in equation (15) is offset, so that as shown in equation (26) the collector current $I_1$ of the transistor 6 is controlled by the base voltage $V_1$ of the transistor 6 and the base voltage $V_2$ of the transistor 7, thereby reducing the distortion of the output signal of the transistor 6. The voltage of the feedback signal supplied to the transistor 6 is regulated by changing the resistance value of the resistor 18 and applied to the base of the transistor 6 in the form of feedback signal voltage minimizing the distortion of the output signal of the transistor 6.

Figure 7:
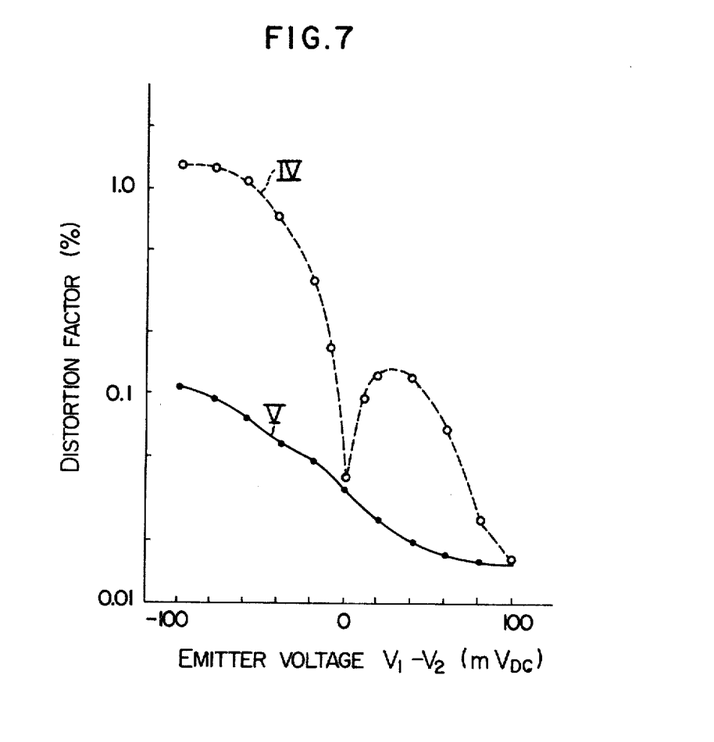
FIG. 7 is a distortion factor characteristics curve of the output signal produced from the gain control circuit of FIG. 6.

The diagram of FIG. 7 shows characteristics curves of the distortion factor of the variable gain control circuit of FIG. 1 and the distortion factor of the variable gain control circuit of FIG. 6. The curve of a broken line IV shows the distortion factor characteristics of the variable gain control circuit shown in FIG. 1. From this curve, it is seen that a maximum value of more than 1.0% of distortion occurs. The curve shown by solid line V, on the other hand, shows the distortion factor characteristics of the variable gain control circuit of FIG. 6. It is noted that a maximum value of 0.1% of distortion factor is involved, the ratio of distortion being not more than 1/10.

Figure 8:
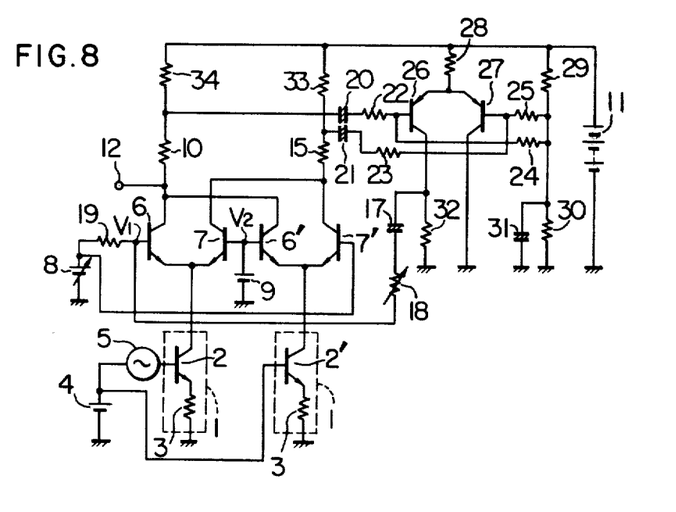
FIG. 8 is a diagram showing another embodiment of the gain control circuit according to the present invention.

A circuit diagram of another embodiment of the gain control circuit according to the present invention is shown in FIG. 8. This embodiment is suitably applicable to the integrated circuits. In the embodiment of FIG. 6, if the base voltage $V_1$ of the transistor 6 is changed, not only the AC signal current but also the DC current changes so that the DC collector voltage of the transistors 6 and 7 change. Therefore, if the voltage $V_1$ of the DC voltage source 8 is changed in step through a digital/analog converter or the like, the DC current changes in step at the terminal 12 resulting in an impulsive noise. This is not desirable for the low-frequency amplifier.

This shortcoming is obviated from the embodiment shown in FIG. 8. In this embodiment, the voltage/current converter circuit 1' comprising the transistor 2' and the resistor 3' is for converting the voltage of the DC power supply 4 into a current. The DC current $I_0$ equal to the collector current of the transistor 2 of the voltage/current converter circuit 1 flows into the collector of the transistor 2'. The transistor 6' and the transistor 7' make up a third differential amplifier and have emitters connected to each other. The junction point of the emitters thereof is connected to the collector of the transistor 2'. The base of the transistor 6' is connected to the base of the transistor 7 on the one hand and to the positive terminal of the bias power supply 9 on the other hand. The base of the transistor 7' is connected to the positive terminal of the bias power supply 8 in such a manner as not to be supplied with the feedback signal. The collector of the transistor 6' is directly connected to the collector of the transistor 6, while the collector of the transistor 6' is directly connected to the collector of the transistor 7. The collector of the transistor 6 is connected to the power supply 11 through the two load resistors 10 and 34 connected in series to each other. The junction point of the two resistors 10 and 34 is connected to the base of the transistor 26. The collector of the transistor 7' is connected to the power supply 11 through the two resistors 15 and 33 connected in series to each other. The junction point of the two resistors 15 and 33 is connected to the base of the transistor 27. The two resistors 33 and 34 are used for reducing the voltage generated by the signal current, thus preventing the saturation at the input terminal of the transistors 26 and 27 making up the second differential amplifier.

In this circuit configuration, the collector current of the transistor 6' is reduced by the amount of increase in the collector current of the transistor 6, while the collector current of the transistor 6' is increased by the amount of decrease in the collector current of the transistor 6. Thus, the DC collector voltage of the transistors 6 and 6' is kept constant, thereby preventing an impulsive noise from being produced at the output terminal.

Since no AC signal current flows into the transistor 6', the variable attenuation characteristics are not adversely affected. The AC voltage generated at the junction point of the collector of the transistor 26 and the resistor 32 is fed back negatively through capacitor 17 and resistor 18 to the base of the transistor 6 in which the AC signal current flows, so that the AC component of the voltage generated by the emitter bulk resistor of the transistor 6 is compensated, thus preventing generation of the distortion.

Figures 9, 10:
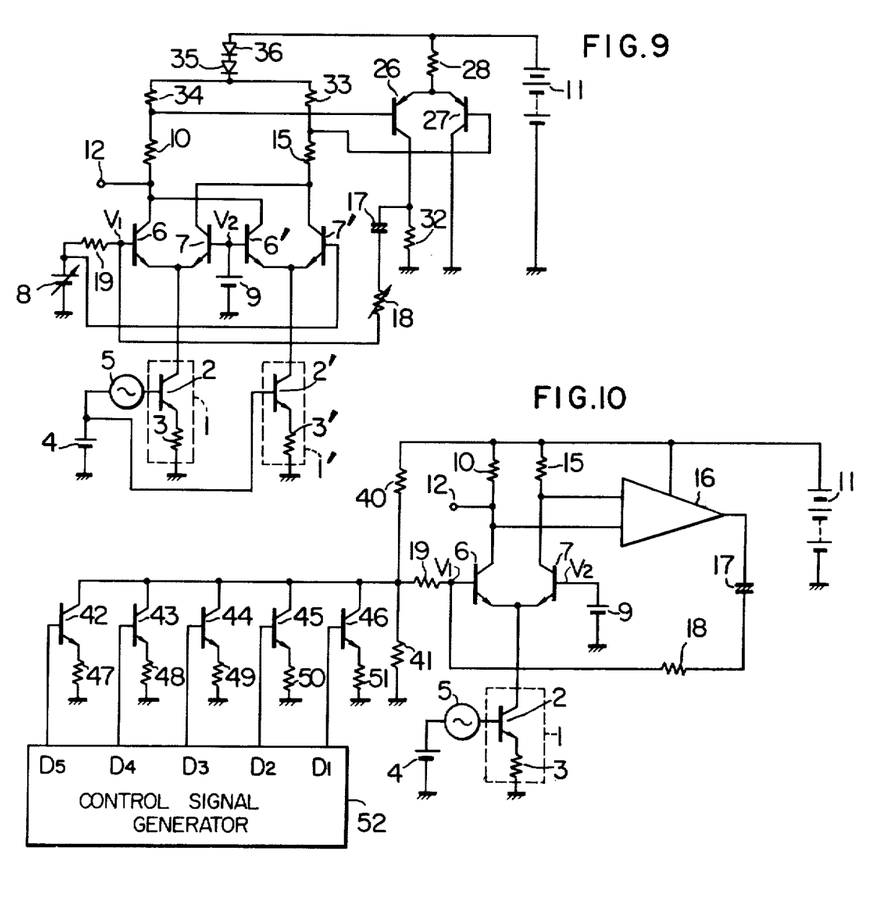
FIG. 9 is a circuit diagram showing still another embodiment of the gain control circuit according to the present invention, which is suitable for semiconductor circuit integration.
FIG. 10 is a circuit diagram showing a further embodiment of the gain control circuit according to the present invention which may be controlled with remote control action.

The diagram of FIG. 9 shows another embodiment in which the variable gain control circuit according to the present invention is more suitably applicable to the integrated circuits. In FIG. 9, two diodes 35 and 36 connected in series with each other at the polarity in forward direction with respect to the polarity of the power supply 11 are inserted between the positive terminal of the power supply 11 and the resistor 33, 34. The junction point of the resistors 10 and 34 is directly connected to the base of the transistor 26, while the junction point of the resistors 15 and 33 is directly connected to the base of the transistor 27.

In the circuit of FIG. 9, the current flows into the diodes 35 and 36 in forward direction so that a predetermined voltage drop occurs in forward direction across the anode and cathode of the diodes 35 and 36. This voltage is applied as a fixed bias voltage to the bases of the transistors 26 and 27. This configuration eliminates the need of a resistor circuit network for generating a fixed bias voltage to be supplied to the bases of the transistors 26 and 27. The transistors 26 and 27 also amplify the DC component of the outputs of the transistors 6, 6', 7 and 7'. Since the DC component of the output signal of the transistor 26 is blocked by the capacitor 17, however, only the AC component is fed back to the base of the transistor 6.

The circuit diagram of FIG. 12 shows another embodiment of the gain control circuit according to the present invention which may be controlled with a remote control action. The base of the transistor 6 is supplied with a bias voltage in the form of voltage which is obtained by dividing the voltage of the power supply 11 by the two resistors 40 and 41 connected between ground and the positive electrode of the power supply 11. The base of the transistor 6 is connected with the collector of the five switching transistors 42 to 46 through a resistor 19. Resistors 47 to 51 are inserted between each of the collectors of the switching transistors 42 to 46 and ground. The bases of the switching transistors 42 to 46 are connected to the output terminals D1 to D5 of the control signal generator 52 respectively. The second differential amplifier is shown by the block 16, one of the input terminals of which is connected to the collector of the transistor 6, the other input thereof being connected to the collector of the transistor 7. The output terminal of the differential amplifier 16 is connected to the base of the transistor 6 through the capacitor 17 and the resistor 18.

In this circuit, the control signal generator 25 receives the signal transmitted by use of, say, an infrared ray and produces a high "1" voltage or a low "0" voltage at the output terminals D1 to D5 in accordance with the nature of the received signal. The resistors 47 to 51 connected to the collectors of the switching transistors 42 to 46 have resistance values increasing in that order. Assume that a high voltage "1" is generated at the first output terminal D1 of the control signal generator 52. The transistor 42 conducts, and the resistor 47 is connected in parallel with the resistor 41. A voltage determined by the dividing ratio of the combined resistance of the resistors 41 and 47 and the value of the resistor 40 is applied as a bias voltage to the transistor 6. Thus the gain of the transistor 6 is changed thereby changing the amplitude of the output signal produced at the output terminal 12. Assume, on the other hand, that the output voltage at the output terminal D5 of the control signal generator 52 becomes "0" while the output voltage at the output terminal D4 becomes high "1". The switching transistor 42 is cut off and the switching transistor 43 conducts. As a result, the resistor 48 is connected in parallel with the resistor 41, so that the combination of the resistors 41 and 48 is increased in value, resulting in an increased base voltage $V_1$ of the transistor 6. Thus the amplitude of the output signal produced at the output terminal 12 is further increased. The base voltage of the transistor 6 is changed in this way by sequentially changing the output voltages produced at the output terminals D1 to D5 of the control signal generator 52, thereby making it possible to operate the control signal generator 52 with a digital signal.

The foregoing description concerns the embodiments of the present invention comprising transistors. The transistor may of course be replaced with equal effect by another amplifier elements such as a field effect transistor (FET) or the like each having an input terminal, an output terminal and a grounding terminal corresponding to the base, collector and emitter of the transistor.

As explained above, by using the gain control circuit according to the present invention, the distortion of 1% or above which is produced in the conventional devices, may be reduced to 0.1% or below, thus realizing a volume control variable attenuator with superior characteristics for the low-frequency amplifier or the like.

I claim:
1. A variable gain control circuit comprising:
   a voltage-current converter circuit for producing an output signal current proportional to the voltage of an input signal at the output terminal thereof in response to said input signal;
   a first differential amplifier constituted by a pair of transistors, each transistor having an input electrode, an output electrode and a common electrode having an inherent bulk resistance, the common electrodes of said pair of transistors being connected to said output terminal of said voltage-current converter circuit;
   a fixed bias voltage source for applying a fixed bias voltage to the input electrode of one of said pair of transistors;
   a variable voltage bias source for applying a bias voltage to the input electrode of the other transistor, said bias voltage being variable;
   an output node connected to the output electrode of said other transistor, an output signal proportional to the output current in the output electrode of the said other transistor being produced at said output node;
   a second differential amplifier having a pair of input circuits and an output circuit, one of said input circuits being connected to the output electrode of said one of transistors, the other input circuit being connected to the output electrode of said other transistor, said output circuit producing an output voltage proportional to the difference between the output currents flowing into said respective electrodes of said pair of transistors; and
   a feedback circuit connected between the output circuit of said second differential amplifier and the input electrode of said other transistor of said first differential amplifier, for feeding back to the input electrode of said other transistor an AC component of an output signal of said second differential amplifier in a substantially equal amplitude to that of an

AC differential voltage produced across the respective emitter bulk resistances of said pair of transistors forming said first differential amplifier.

2. A variable gain control circuit comprising:

a voltage-current conversion transistor having a base electrode, an emitter electrode and a collector electrode, an input signal being applied between said base electrode and said emitter electrode, an output current proportional to the voltage of said input signal being produced at said collector electrode;

a first and a second amplifying transistor each having a base electrode, an emitter electrode having an inherent bulk resistance and a collector electrode, the emitter electrodes of said first and second transistors being connected to each other, the junction point of which is connected to said collector of said voltage-current conversion transistor;

a first bias voltage source for applying a fixed bias voltage to said base electrode of said first amplifying transistor;

a second bias voltage source for applying a bias voltage to said base electrode of said second amplifying transistor, said bias voltage being variable;

an output terminal connected to said collector electrode of said second amplifying transistor;

a third and a fourth amplifying transistor each having a base electrode, an emitter electrode and a collector electrode, the emitter electrodes of said third and fourth transistors being connected to each other, the junction point of which is connected to an impedance element common to said emitter electrodes;

a first AC signal path for connecting said base electrode of said third amplifying transistor to said collector electrode of said first amplifying transistor;

a second AC signal path for connecting said base electrode of said fourth amplifying transistor to said collector of said second AC amplifying transistor; and a feedback circuit connected between said collector electrode of said fourth amplifying transistor and said base electrode of said second amplifying transistor, for feeding back to said base electrode of said second amplifying transistor an AC component of an output signal of said fourth amplifying transistor in substantially equal amplitude to that of an AC differential voltage produced across the respective emitter bulk resistances of said first and second amplifying transistors.

3. A variable gain circuit comprising:

a first voltage-current conversion transistor each having a base electrode, an emitter electrode and a collector electrode; an AC input signal being applied between said base electrode and said emitter electrode, an AC output current proportional to the voltage of said input signal being produced at said collector electrode;

a first bias voltage source for applying a fixed bias voltage between said base electrode and said emitter electrode of said first voltage-current conversion transistor, thereby causing a DC current corresponding to said bias voltage to flow at said collector electrode;

a second voltage-current conversion transistor having a base electrode, an emitter electrode and a collector electrode, said first bias voltage source being connected between said base electrode and said emitter electrode, a DC output current proportional to the bias voltage of said first bias voltage source being produced at said collector electrode;

a first and a second amplifying transistor each having a base electrode, an emitter electrode having an inherent bulk resistance and a collector electrode, the respective emitter electrodes of said first and second amplifying transistors being connected to each other, the junction point of which is connected to said collector electrode of said first voltage-current conversion transistor;

a third amplifying transistor having a base electrode, an emitter electrode and a collector electrode, said base electrode of said third amplifying transistor being connected to said base electrode of said second amplifying transistor, said collector electrode of said third amplifying transistor being connected to said collector electrode of said first amplifying transistor;

a fourth amplifying transistor having a base electrode, an emitter electrode and a collector electrode, said base electrode of said fourth amplifying transistor being connected to said base electrode of said first amplifying transistor, said collector electrode of said fourth amplifying transistor being connected to said collector electrode of said second amplifying transistor;

a DC path for connecting said respective emitter electrodes of said third and fourth amplifying transistors to said collector electrode of said second voltage-current conversion transistor;

a second bias voltage source for applying a bias voltage to said respective base electrode of said first and fourth amplifying transistors, said bias voltage being variable;

an output terminal connected to said collector electrode of said first amplifying transistor;

a differential amplifier having a first and a second input circuit, said first input circuit being connected to said collector electrode of said first amplifying transistor, said second input circuit being connected to said collector electrode of said second amplifying transistor, an output voltage proportional to a difference of said AC output currents flowing in the respective collector electrodes of said first and second amplifying transistors being produced; and a feedback circuit connected between said output circuit of said differential amplifier and said base electrode of said first amplifying transistor, for feeding back to the base electrode of said first amplifying transistor and AC component of an output signal of said differential amplifier in substantially equal amplitude to that of a voltage difference between the AC voltages produced across the respective emitter bulk resistances of said first and second amplifying transistors.

4. A variable gain control circuit according to claim 3, further comprising:

a first and a second load resistor each connected to said respective collector electrodes of said first and second amplifying transistors, respectively;

a first fixed resistor connected in series to said first load resistor;

a second fixed resistor connected in series to said second load resistor;

a diode connected in series to said first and second fixed resistor and inserted in forward direction with respect to a power supply between said power supply and said first and second fixed resistor;

a first circuit means for connecting said first input circuit of said differential amplifier in the fashion of DC conduction to the junction point of said first load resistor and said first fixed resistor; and a second circuit means for connecting said second input circuit of said differential amplifier to the junction point of said second load resistor and said second fixed resistor in the fashion of DC condition.

5. A variable gain control circuit according to claim 3, wherein the voltage of said second bias voltage source is controlled by a remote control.

* * * * *